(12) United States Patent
Zhu

(10) Patent No.: US 9,978,889 B2
(45) Date of Patent: *May 22, 2018

(54) CONDUCTIVE CONTACT FOR SOLAR CELL

(71) Applicant: SUNPOWER CORPORATION, San Jose, CA (US)

(72) Inventor: Xi Zhu, Milpitas, CA (US)

(73) Assignee: SunPower Corporation, San Jose, CA (US)

( * ) Notice: Subject to any disclaimer, the term of this patent is extended or adjusted under 35 U.S.C. 154(b) by 7 days.

This patent is subject to a terminal disclaimer.

(21) Appl. No.: 14/847,502

(22) Filed: Sep. 8, 2015

(65) Prior Publication Data

US 2015/0380578 A1 Dec. 31, 2015

Related U.S. Application Data

(63) Continuation of application No. 13/629,447, filed on Sep. 27, 2012, now Pat. No. 9,153,712.

(51) Int. Cl.
*H01L 31/0224* (2006.01)

(52) U.S. Cl.
CPC ...... *H01L 31/022441* (2013.01); *Y02E 10/50* (2013.01)

(58) Field of Classification Search
CPC .............................................. H01L 31/022441
USPC ................................................. 136/256, 261
See application file for complete search history.

(56) References Cited

U.S. PATENT DOCUMENTS

| 4,321,283 | A | * | 3/1982 | Patel ..................... H01L 21/288 |
| | | | | 136/256 |
| 4,451,969 | A | * | 6/1984 | Chaudhuri ............ H01L 21/288 |
| | | | | 136/256 |
| 9,153,712 | B2 | * | 10/2015 | Zhu ................. H01L 31/022441 |
| 2008/0216887 | A1 | | 9/2008 | Hacke et al. |
| 2010/0269893 | A1 | | 10/2010 | Prince et al. |
| 2011/0006268 | A1 | | 1/2011 | Wang et al. |
| 2011/0114170 | A1 | | 5/2011 | Lee et al. |
| 2012/0037220 | A1 | | 2/2012 | Jee et al. |
| 2012/0042924 | A1 | | 2/2012 | Lee |

(Continued)

FOREIGN PATENT DOCUMENTS

| CN | 102097153 | 6/2011 |
| KR | 10-2010-0056114 | 5/2010 |
| TW | 200727503 | 7/2007 |

OTHER PUBLICATIONS

First Office Action for Taiwanese Patent Application No. 102135220 dated Dec. 27, 2016, 4 pgs., no English translation.

(Continued)

*Primary Examiner* — Angelo Trivisonno
(74) *Attorney, Agent, or Firm* — Schwabe, Williamson & Wyatt, P.C.

(57) ABSTRACT

Conductive contacts for solar cells and methods of forming conductive contacts for solar cells are described. For example, a solar cell includes a substrate. A conductive contact is disposed on the substrate. The conductive contact includes a layer composed of a first metal species having a plurality of pores. The conductive contact also includes a second metal species disposed in the plurality of pores. Portions of both the first and second metal species are in contact with the substrate.

9 Claims, 3 Drawing Sheets

(56) References Cited

U.S. PATENT DOCUMENTS

2012/0204938 A1   8/2012   Hacke et al.

OTHER PUBLICATIONS

First Action Interview Pre-Interview Communication from U.S. Appl. No. 13/629,447 dated Feb. 5, 2015, 6 pgs.
International Preliminary Report on Patentability from PCT/US2013/062463 dated Apr. 9, 2015, 11 pgs.
International Search Report and Written Opinion of the International Searching Authority dated Jan. 28, 2014, in International Patent Application No. PCT/US2013/062463.

* cited by examiner

CONDUCTIVE CONTACT FOR SOLAR CELL

CROSS-REFERENCE TO RELATED APPLICATIONS

This application is a continuation of U.S. patent application Ser. No. 13/629,447, filed on Sep. 27, 2012, the entire contents of which are hereby incorporated by reference herein.

TECHNICAL FIELD

Embodiments of the present invention are in the field of renewable energy and, in particular, conductive contacts for solar cells and methods of forming conductive contacts for solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present invention allow for increased solar cell manufacture efficiency by providing novel processes for fabricating solar cell structures. Some embodiments of the present invention allow for increased solar cell efficiency by providing novel solar cell structures.

DETAILED DESCRIPTION

Figure 1:
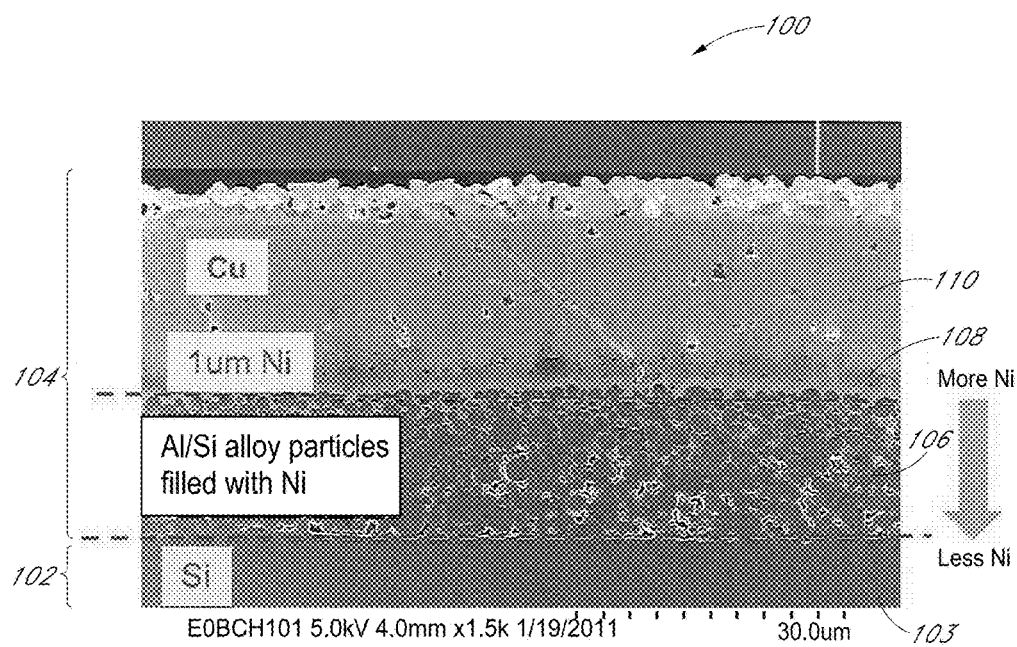
FIG. 1 is a cross-sectional scanning electron microscope (X-SEM) image of a portion of a contact for a solar cell, in accordance with an embodiment of the present invention.

Conductive contacts for solar cells and methods of forming conductive contacts for solar cells are described herein. In the following description, numerous specific details are set forth, such as specific process flow operations, in order to provide a thorough understanding of embodiments of the present invention. It will be apparent to one skilled in the art that embodiments of the present invention may be practiced without these specific details. In other instances, well-known fabrication techniques, such as lithography and patterning techniques, are not described in detail in order to not unnecessarily obscure embodiments of the present invention. Furthermore, it is to be understood that the various embodiments shown in the figures are illustrative representations and are not necessarily drawn to scale.

Disclosed herein are solar cells having conductive contacts. In an embodiment, a solar cell includes a substrate. A conductive contact is disposed on the substrate. The conductive contact includes a layer composed of a first metal species having a plurality of pores. The conductive contact also includes a second metal species disposed in the plurality of pores. Portions of both the first and second metal species are in contact with the substrate. In another embodiment, a solar cell includes a silicon substrate. A conductive contact is disposed on the silicon substrate. The conductive contact includes a first conductive layer composed of aluminum (Al) containing particles having a plurality of pores. The first conductive layer also includes nickel (Ni) disposed in the plurality of pores. Portions of both the Al containing particles and the Ni are in contact with the silicon substrate. In another embodiment, a back-contact solar cell includes a bulk N-type silicon substrate. A conductive contact is disposed on a surface of the bulk N-type silicon substrate opposing a light receiving surface of the bulk N-type silicon substrate. The conductive contact includes a first conductive layer composed of aluminum/silicon (Al/Si) alloy particles having a plurality of pores. Nickel (Ni) is disposed in the plurality of pores. Portions of both the aluminum/silicon (Al/Si) alloy particles and the Ni are in contact with the bulk N-type silicon substrate. A portion of the Ni forms a silicide with a portion of the bulk N-type silicon substrate. A second conductive layer composed substantially of Ni, but not Al or Cu, is disposed on the first conductive layer. A third conductive layer composed substantially of copper (Cu) is disposed on the second conductive layer.

Also disclosed herein are methods of fabricating solar cells having conductive contacts. In an embodiment, a method of fabricating a back-contact solar cell includes forming a conductive contact on a surface of a bulk N-type silicon substrate opposing a light receiving surface of the bulk N-type silicon substrate. The forming includes forming a first conductive layer composed of aluminum/silicon (Al/Si) alloy particles having a plurality of pores. Nickel (Ni) is disposed in the plurality of pores. Portions of both the aluminum/silicon (Al/Si) alloy particles and the Ni are in contact with the bulk N-type silicon substrate. The method also includes forming, on the first conductive layer, a second conductive layer composed substantially of Ni, but not Al or Cu. The method also includes forming, on the second conductive layer, a third conductive layer composed substantially of copper (Cu).

One or more embodiments described herein are directed to approaches to, and structures resulting from, reducing the contact resistance of printed Al seed formed on a silicon substrate by incorporating electroless-plated Ni therein. For example, during fabrication of solar contacts for solar cells it was realized that, e.g., by X-SEM imaging, following Ni deposition by electroless plating on top of printed Al, Ni formed on the surface of Al particles. Such formation was accompanied by a filling of voids or pores present in an Al paste. The resulting contacts suffered from less contact resistance as compared with conventional contacts, e.g., Al-only contacts. The results can be particularly useful for the fabrication of back-contact solar cells where thermal budget and restricted silicon consumption can hinder good metal to silicon contact formation. However, it is to be understood that embodiments described herein may be useful for both back-contact solar cells and front-contact solar cells.

Further to the above described issues, the contact resistance of printed contacts tends to be lower than contacts formed by vacuum deposited metal. One possibility for the reduced resistance is that the porosity of a seed paste can limit the actual contact areas between the metal and silicon. There are a couple of conventional approaches normally used to reduce the contact resistance of a solar cell. The first involves tuning the formulation design of the seed layer of the contacts. Different additives (e.g., binders/frits) can be added to improve the adhesion between the paste and the silicon substrate. However, there can be a practical limit of how much metal is in contact with the silicon after firing (e.g., annealing) the final contact metal stack. The second conventional approach involves tuning the firing profile. Similar to the first approach, it can lower the contact resistance to a certain degree, but the porosity of the paste can still pose a limiting factor for attempts to reducing contact resistance.

More specifically, one or more embodiments are directed to contact formation starting with an Al paste seed layer. Annealing is performed after seed printing to form contact between Al from the past and an underlying silicon substrate. Then Ni is deposited by electroless plating on top of Al paste. Since the paste has a porous structure, the Ni forms not only above, but also on the outside of the Al particles, and fills up at least a portion of the empty space. The Ni may be graded in that more Ni may form on upper portions of the Al (away from the Si). Nonetheless, the Ni on the outside of the Al particles can be utilized to reduce the contact resistance of a contact ultimately formed there from. In particular, if the thickness of the Al paste is generally reduced, more Ni can accumulate at the Al to silicon interface. When annealing is performed after Ni electroless plating, instead of after seed printing, a NiSi contact can form at the Ni—Si interface. Furthermore, an Al—Si contact can form at the Al—Si interface by having the Ni present in voids or pores of the Al particles. Compared to conventional approaches, the contacts formed can have a greater surface area of actual metal to silicon contact within a given region of the contact structure formation. As a result, the contact resistance can be lowered relative to conventional contacts.

As an example of the concepts described above, FIG. 1 is a cross-sectional scanning electron microscope (X-SEM) image 100 of a portion of a contact for a solar cell, in accordance with an embodiment of the present invention. FIG. 2 is a cross-sectional illustration of a portion 200 of the contact structure of FIG. 1, in accordance with an embodiment of the present invention.

Figure 2:
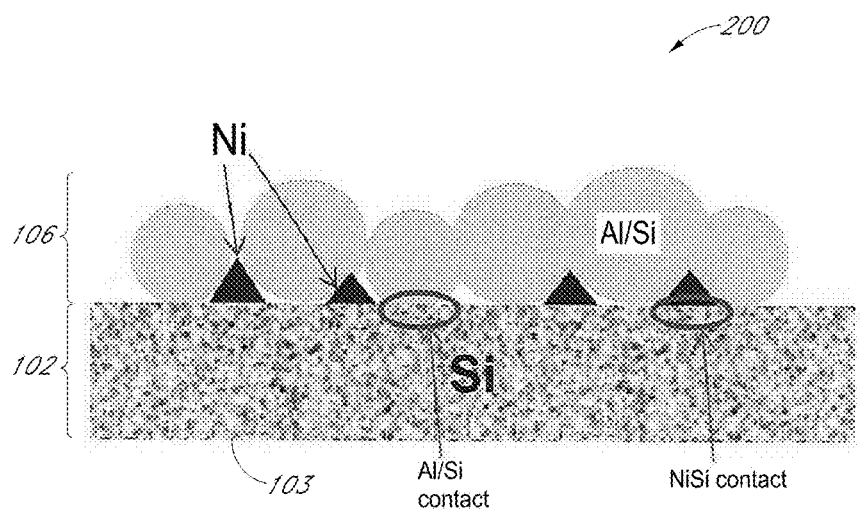
FIG. 2 is a cross-sectional illustration of a portion of the contact structure of FIG. 1, in accordance with an embodiment of the present invention.

Referring to FIG. 1 a metal stack 104 of a contact structure for a substrate 102 of a solar cell includes three discernible metal layer portions 106, 108 and 110. The first metal layer portion 106 is a seed layer composed of a seed layer of porous Al particles. The Al particles have Ni formed in the spaces and voids thereof, e.g., from Ni plating on top of the Al seed layer. The second metal layer portion 108 is composed of Ni formed above, but not within, the Al particles from the same or similar Ni deposition process. As highlighted in FIG. 1, a higher concentration of Ni is present at the upper surface of the first metal layer portion 106 than at the bottom of that layer. The third metal layer portion 110 is composed of copper formed above the second metal layer portion 108.

Referring to FIG. 2, although the concentration of Ni can be higher at the upper surface of the first metal layer portion 106 than at the bottom of that layer, Ni can still come in contact with the silicon substrate surface nonetheless. Accordingly, at the interface of substrate 102 and the first metal layer portion 106, both Al/Si and NiSi contacts can be formed, as depicted in FIG. 2. Furthermore, in an embodiment, since a greater concentration of Ni can form on the top (away from Si), if the thickness of the Al paste is reduced, the amount of Ni ultimately present at the Si interface can be tailored. Also, in an embodiment, when annealing is performed, a highly conductive nickel silicide (NiSi) material can be formed underneath the Ni—Si interface.

Accordingly, referring to both FIGS. 1 and 2, in an embodiment, a solar cell includes a substrate 102. A conductive contact 104 is disposed on the substrate 102. The conductive contact 104 includes a layer 106 composed of a first metal species having a plurality of pores. The conductive contact 104 also includes a second metal species disposed in the plurality of pores of the layer 106. Portions of both the first and second metal species are in contact with the substrate 102.

In an embodiment, the first metal species is aluminum (Al) and the second metal species is nickel (Ni). In one such embodiment, the aluminum is included as a plurality of aluminum/silicon (Al/Si) alloy particles. In a specific such embodiment, a majority of the Al/Si alloy particles has a diameter approximately in the range of 1-5 microns, and a majority of the pores has a diameter approximately in the range of 0.1-1 microns. In an embodiment, the conductive contact 104 is a back-contact for the solar cell. However, in an alternative embodiment, the contact 104 is a front contact for the solar cell.

In an embodiment, a concentration of the second metal species is graded higher in concentration distal from the substrate 102 and lower in concentration proximate to the substrate 102. In an alternative embodiment, however, a concentration of the second metal species is homogeneous throughout the plurality of pores of the first metal species. In an embodiment, the substrate 102 is a bulk silicon substrate, and a portion of the second metal species forms a silicide with a portion of the bulk silicon substrate. In an embodiment, the solar cell further includes a layer 110 composed substantially of a third metal species and disposed above the layer 106 including the first metal species and the second metal species. In one such embodiment, the third metal species is copper (Cu). In another such embodiment, a third layer 108 composed substantially of the second metal species, but not the first or second metal species, is disposed between the layer 110 and the layer 106.

Referring again to both FIGS. 1 and 2, in another embodiment, a solar cell includes a silicon substrate 102. A conductive contact 104 is disposed on the silicon substrate 102. The conductive contact includes a first conductive layer 106 composed of aluminum (Al) containing particles having a plurality of pores. The first conductive layer 106 also includes nickel (Ni) disposed in the plurality of pores. Portions of both the Al containing particles and the Ni are in contact with the silicon substrate 102.

In an embodiment, a concentration of the Ni is graded higher in concentration distal from the silicon substrate 102 and lower in concentration proximate to the silicon substrate 102. In an alternative embodiment, however, a concentration of the Ni is homogeneous throughout the plurality of pores of the Al containing particles. In an embodiment, the Al containing particles are aluminum/silicon (Al/Si) alloy particles. In an embodiment, a portion of the Ni forms a silicide with a portion of the silicon substrate 102. In an embodiment, the solar cell further includes another conductive layer 110 composed substantially of copper (Cu) and disposed above the first conductive layer 106. Another conductive layer 108 composed substantially of Ni, but not Al or Cu, is disposed between the conductive layers 106 and 110.

Referring again to both FIGS. 1 and 2, in another embodiment, a back-contact solar cell includes a bulk N-type silicon substrate 102. A conductive contact 104 is disposed on a surface of the bulk N-type silicon substrate 102 opposing a light receiving surface 103 of the bulk N-type silicon substrate 102. The conductive contact 104 includes a first conductive layer 106 composed of aluminum/silicon (Al/Si) alloy particles having a plurality of pores. Nickel (Ni) is disposed in the plurality of pores. Portions of both the aluminum/silicon (Al/Si) alloy particles and the Ni are in contact with the bulk N-type silicon substrate 102. A portion of the Ni forms a silicide with a portion of the bulk N-type silicon substrate 102. A second conductive layer 108 composed substantially of Ni, but not Al or Cu, is disposed on the first conductive layer 106. A third conductive layer 110 composed substantially of copper (Cu) is disposed on the second conductive layer 108. In one embodiment, a concentration of the Ni is graded higher in concentration distal from the bulk N-type silicon substrate 102 and lower in concentration proximate to the bulk N-type silicon substrate 102. In an alternative embodiment, a concentration of the Ni is homogeneous throughout the plurality of pores of the aluminum/silicon (Al/Si) alloy particles.

Figure 3:
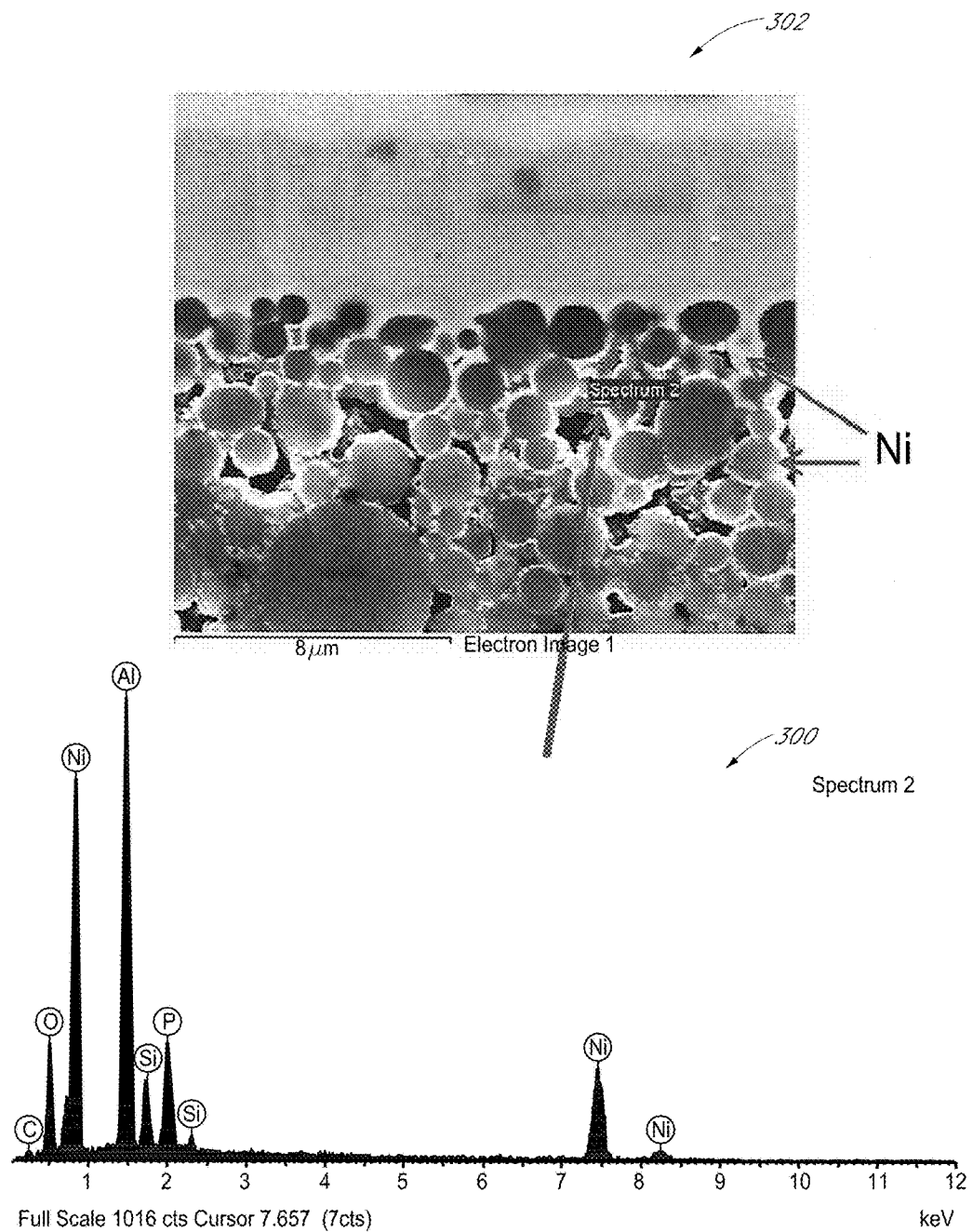
FIG. 3 includes a plot of an EXD measurement of a portion of the metal stack of FIG. 1 (included as an X-SEM image in FIG. 3), in accordance with an embodiment of the present invention.

As an example of experimental verification that Ni can be used to fill voids in Al particles from an Al paste, FIG. 3 includes a plot 300 of an EXD measurement of a portion of the metal stack of FIG. 1 (included as X-SEM image 302), in accordance with an embodiment of the present invention. Referring to plot 300 and image 302, the experimental data verifies that the metal species formed in an around the Al particles is Ni.

Although certain materials are described specifically above, some materials may be readily substituted with others with other such embodiments remaining within the spirit and scope of embodiments of the present invention. For example, in an embodiment, a different material substrate, such as a group III-V material substrate, can be used instead of a silicon substrate. In another embodiment, silver (Ag) particles or the like can be used in a seed paste instead of, or in addition to, Al particles. In another embodiment, plated or like-deposited cobalt (Co) or tungsten (W) can be used instead of or in addition to the plated Ni described above.

Furthermore, the formed contacts need not be formed directly on a bulk substrate. For example, in one embodiment, conductive contacts such as those described above are formed on semiconducting regions formed above (e.g., on a back side of) as bulk substrate. As an example, FIGS. 4A-4C illustrate cross-sectional views of various processing operations in a method of fabricating solar cells having conductive contacts, in accordance with an embodiment of the present invention.

Figure 4A:
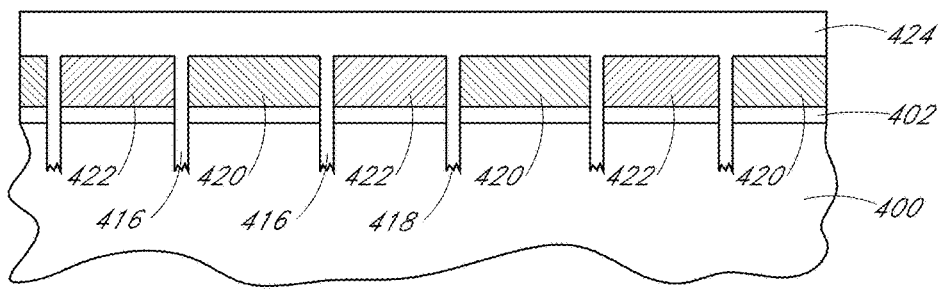
FIGS. 4A-4C illustrate cross-sectional views of various processing operations in a method of fabricating solar cells having conductive contacts, in accordance with an embodiment of the present invention.
Figure 4B:
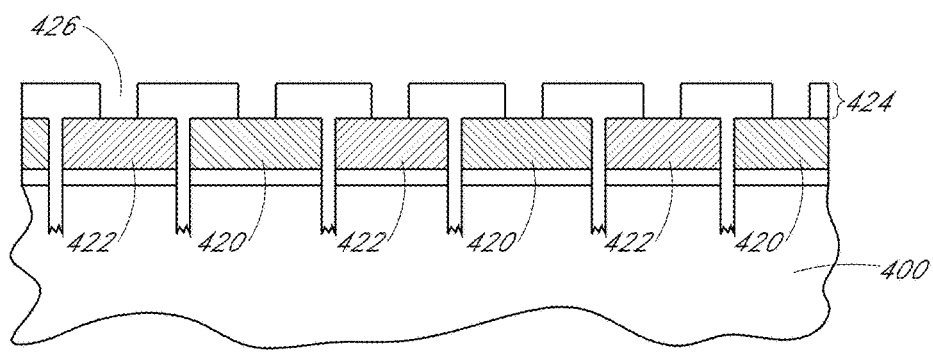
Figure 4C:
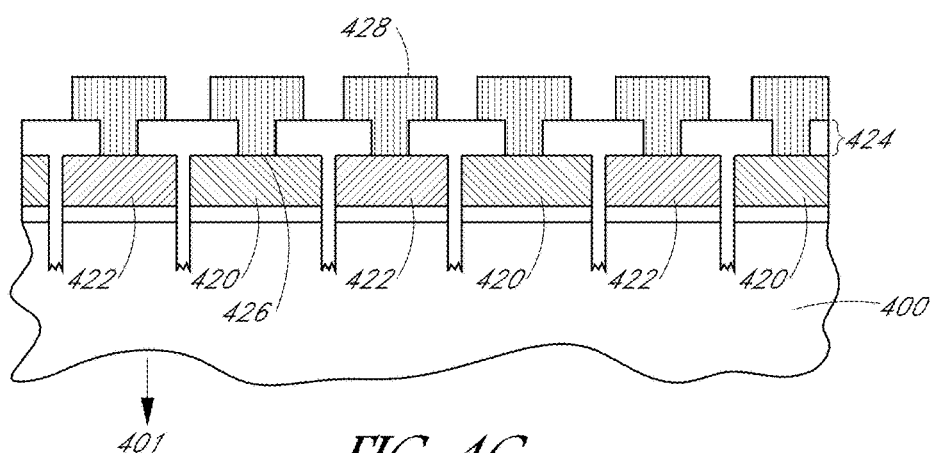

Referring to FIG. 4A, a method of forming contacts for a back-contact solar cell includes forming a thin dielectric layer 402 on a substrate 400.

In an embodiment, the thin dielectric layer 402 is composed of silicon dioxide and has a thickness approximately in the range of 5-50 Angstroms. In one embodiment, the thin dielectric layer 402 performs as a tunneling oxide layer. In an embodiment, substrate 400 is a bulk single-crystal substrate, such as an n-type doped single crystalline silicon substrate. However, in an alternative embodiment, substrate 400 includes a polycrystalline silicon layer disposed on a global solar cell substrate.

Referring again to FIG. 4A, trenches 416 are formed between n-type doped polysilicon regions 420 and p-type doped polysilicon regions 422. Portions of the trenches 416 can be texturized to have textured features 418, as is also depicted in FIG. 4A.

Referring again to FIG. 4A, a dielectric layer 424 is formed above the plurality of n-type doped polysilicon regions 420, the plurality of p-type doped polysilicon regions 422, and the portions of substrate 400 exposed by trenches 416. In one embodiment, a lower surface of the dielectric layer 424 is formed conformal with the plurality of n-type doped polysilicon regions 420, the plurality of p-type doped polysilicon regions 422, and the exposed portions of substrate 400, while an upper surface of dielectric layer 424 is substantially flat, as depicted in FIG. 4A. In a specific embodiment, the dielectric layer 424 is an anti-reflective coating (ARC) layer.

Referring to FIG. 4B, a plurality of contact openings 426 are formed in the dielectric layer 424. The plurality of contact openings 426 provide exposure to the plurality of n-type doped polysilicon regions 420 and to the plurality of p-type doped polysilicon regions 422. In one embodiment, the plurality of contact openings 426 is formed by laser ablation. In one embodiment, the contact openings 426 to the n-type doped polysilicon regions 420 have substantially the same height as the contact openings to the p-type doped polysilicon regions 422, as depicted in FIG. 4B.

Referring to FIG. 4C, the method of forming contacts for the back-contact solar cell further includes forming conductive contacts 428 in the plurality of contact openings 426 and coupled to the plurality of n-type doped polysilicon regions 420 and to the plurality of p-type doped polysilicon regions 422. In an embodiment, the conductive contacts 428 are composed of metal and are formed by a deposition (described in greater detail below), lithographic, and etch approach.

Thus, in an embodiment, conductive contacts 428 are formed on or above a surface of a bulk N-type silicon substrate 400 opposing a light receiving surface 401 of the bulk N-type silicon substrate 400. In a specific embodiment, the conductive contacts are formed on regions (422/42) above the surface of the substrate 400, as depicted in FIG. 4C. The forming can include forming a first conductive layer composed of aluminum/silicon (Al/Si) alloy particles having a plurality of pores, and nickel (Ni) disposed in the plurality of pores. Portions of both the aluminum/silicon (Al/Si) alloy particles and the Ni are in contact with the regions 420/422 above the bulk N-type silicon substrate 400 (or in other embodiments, in direct contact with the bulk N-type silicon substrate 400). A second conductive layer is formed on the first conductive layer is composed substantially of Ni, but not Al or Cu. A third conductive layer is then formed on the second conductive layer is composed substantially of copper (Cu).

In an embodiment, forming the first conductive layer includes printing a paste on the bulk N-type silicon substrate. The paste is composed of a solvent and the aluminum/silicon (Al/Si) alloy particles. The printing includes using a technique such as, but not limited to, screen printing or ink jet printing.

In an embodiment, forming the first conductive layer includes depositing the Ni by an electroless deposition technique. In an embodiment, forming the first conductive layer includes heating the aluminum/silicon (Al/Si) alloy particles, but not the Ni, to a temperature approximately in the range of 500-600 degrees Celsius. In an embodiment, forming the first conductive layer includes heating the aluminum/silicon (Al/Si) alloy particles and the Ni to a temperature approximately in the range of 500-600 degrees Celsius. In an embodiment, the forming of the Ni of the first conductive layer and the forming of the second conductive layer are performed in the same process operation. In an embodiment, forming the third conductive layer includes depositing the Cu by an electro-plating deposition technique.

Thus, conductive contacts for solar cells and methods of forming conductive contacts for solar cells have been disclosed. In accordance with an embodiment of the present invention, a solar cell includes a substrate. A conductive contact is disposed on the substrate. The conductive contact includes a layer composed of a first metal species having a plurality of pores. The conductive contact also includes a second metal species disposed in the plurality of pores. Portions of both the first and second metal species are in contact with the substrate. In one embodiment, the first metal species is aluminum (Al) and the second metal species is nickel (Ni).

What is claimed is:

1. A solar cell, comprising:
   a substrate; and
   a conductive contact disposed on the substrate, the conductive contact comprising a layer comprising a first metal species having a plurality of pores, and a different second metal species disposed in the plurality of pores, wherein portions of both the first and second metal species are in contact with the substrate, wherein a concentration of the second metal species is graded higher in concentration distal from the substrate and lower in concentration proximate to the substrate, and wherein a majority of the plurality of pores has a diameter approximately in the range of 0.1-1 microns, wherein the first metal species in aluminum (Al), wherein the aluminum is included as a plurality of aluminum/silicon (Al/Si) alloy particles, and wherein a majority of the Al/Si alloy particles has a diameter approximately in the range of 1-5 microns.

2. The solar cell of claim 1, wherein the substrate is a bulk silicon substrate, and wherein a portion of the second metal species forms a silicide with a portion of the bulk silicon substrate.

3. The solar cell of claim 1, further comprising:
   a second layer substantially comprising a third metal species disposed above the layer comprising the first metal species and the second metal species.

4. The solar cell of claim 3, wherein the third metal species is copper (Cu).

5. The solar cell of claim 3, further comprising:
   a third layer substantially comprising the second metal species, but not the first or second metal species, the third layer disposed between the second layer and the layer comprising the first metal species and the second metal species.

6. The solar cell of claim 1, wherein the conductive contact is a back-contact.

7. The solar cell of claim 1, wherein the second metal species is nickel (Ni).

8. A back-contact solar cell, comprising:
   a bulk N-type silicon substrate; and
   a conductive contact disposed on a surface of the bulk N-type silicon substrate opposing a light receiving surface of the bulk N-type silicon substrate, the conductive contact comprising:
      a first conductive layer comprising aluminum/silicon (Al/Si) alloy particles having a plurality of pores, and a different second metal species disposed in the plurality of pores, wherein portions of both the aluminum/silicon (Al/Si) alloy particles and the second metal species are in contact with the bulk N-type silicon substrate, wherein a portion of the second metal species forms a silicide with a portion of the bulk N-type silicon substrate, and wherein a majority of the plurality of pores has a diameter approximately in the range of 0.1-1 microns;
      a second conductive layer substantially comprising the second metal species, but not Al, the second conductive layer disposed on the first conductive layer; and
   a third conductive layer substantially comprising a different third metal species disposed on the second conductive layer, wherein a concentration of the second metal species is graded higher in concentration distal from the bulk N-type silicon substrate and lower in concentration proximate to the bulk N-type silicon substrate, wherein a majority of the Al/Si alloy particles has a diameter approximately in the range of 1-5 microns.

9. The back-contact solar cell of claim 8, wherein the second metal species is nickel (Ni).

* * * * *